(12) United States Patent
Young et al.

(10) Patent No.: US 7,365,624 B2
(45) Date of Patent: Apr. 29, 2008

(54) MAGNETIC STRUCTURE ASSEMBLY

(75) Inventors: George Young, County Dublin (IE); Patrick Walsh, Dublin (IE)

(73) Assignee: Commergy Technologies Limited, Dublin (IE)

( * ) Notice: Subject to any disclaimer, the term of this patent is extended or adjusted under 35 U.S.C. 154(b) by 0 days.

(21) Appl. No.: 10/509,026

(22) PCT Filed: Mar. 27, 2003

(86) PCT No.: PCT/IE03/00048

§ 371 (c)(1),
(2), (4) Date: Apr. 7, 2005

(87) PCT Pub. No.: WO03/081614

PCT Pub. Date: Oct. 2, 2003

(65) Prior Publication Data

US 2005/0174207 A1    Aug. 11, 2005

(30) Foreign Application Priority Data

Mar. 27, 2002  (IE)  ............................... S2002/0221
Mar. 27, 2002  (IE)  ............................... S2002/0223

(51) Int. Cl.
*H01F 27/02* (2006.01)
*H01F 27/24* (2006.01)

(52) U.S. Cl. ........................................ 336/83; 336/212

(58) Field of Classification Search ................ 336/200, 336/232, 223, 212, 83, 180, 182, 222
See application file for complete search history.

(56) References Cited

U.S. PATENT DOCUMENTS

| 4,803,609 A * | 2/1989 | Gillett et al. ............... 363/17 |
| 5,568,111 A | 10/1996 | Metsler |
| 5,990,776 A * | 11/1999 | Jitaru ........................ 336/200 |
| 6,525,632 B2 * | 2/2003 | Schneider et al. ............ 335/35 |

(Continued)

FOREIGN PATENT DOCUMENTS

GB    1 249 823 A    10/1971

(Continued)

OTHER PUBLICATIONS

Patent Abstracts of Japan, vol. 1996, No. 01, Jan. 31, 1996.

(Continued)

*Primary Examiner*—Anh Mai
(74) *Attorney, Agent, or Firm*—Birch, Stewart, Kolasch & Birch, LLP

(57) ABSTRACT

There is illustrated the assembly of a dual inductor (1) on to a printed circuit board (2). A printed circuit board (2) has a through hole (3). Then the first winding (5), formed from a stamping, is mounted across the hole (3). Then, the first winding (5) is connected to the first face (7) of the PCB (2). Then, a core assembly (10) is inserted into the hole (3) from the direction of a second face (8) of the PCB (2). Then, at some stage, for example as shown, the second winding (6) is inserted into the core assembly (10) and affixed to the bottom face (8) of the PCB (2).

11 Claims, 5 Drawing Sheets

U.S. PATENT DOCUMENTS

Figure 1:
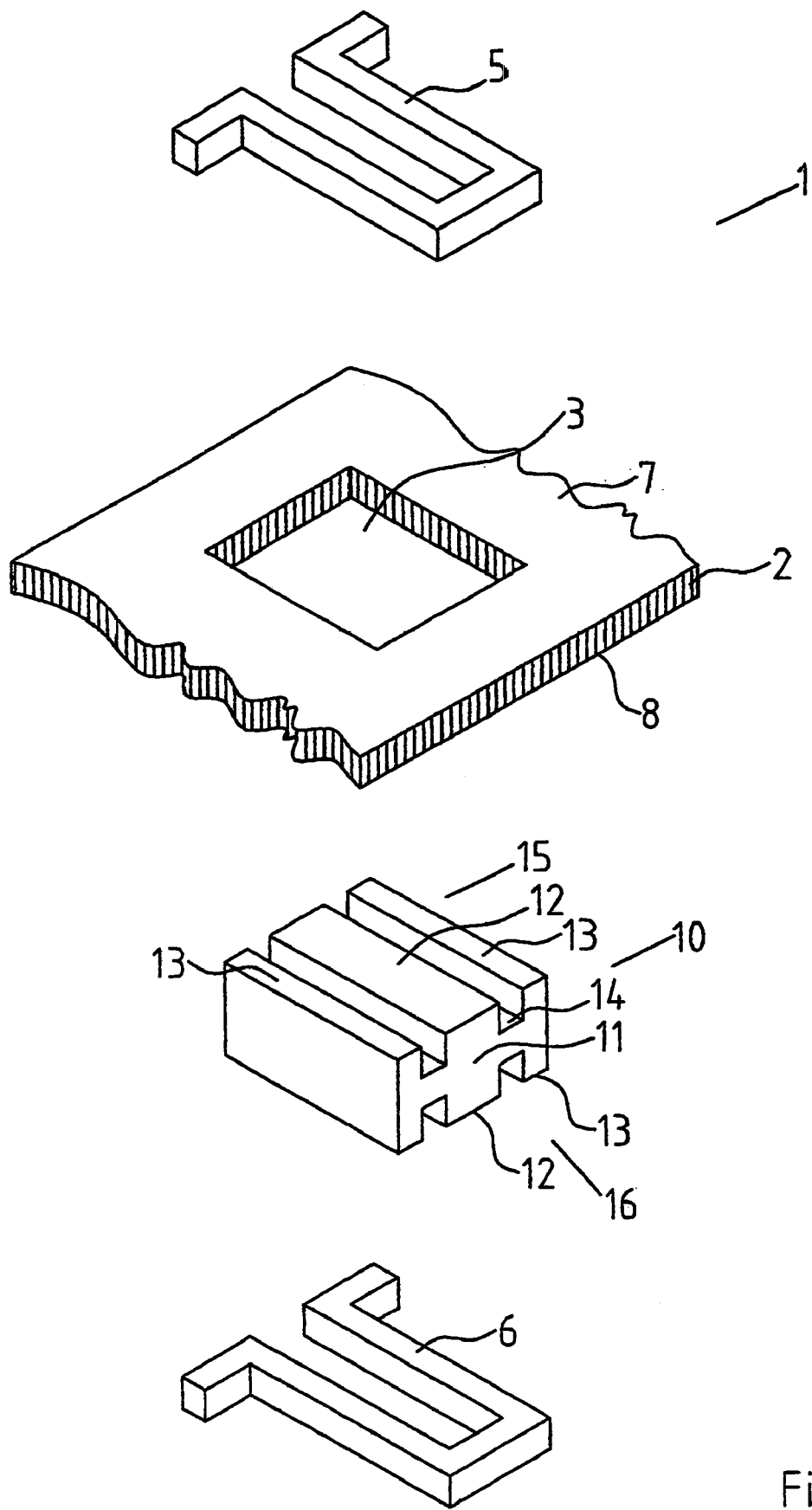

| | | | |
|---|---|---|---|
| 6,677,847 B1 * | 1/2004 | Ferencz | 336/200 |
| 6,765,468 B2 * | 7/2004 | Chen et al. | 336/83 |
| 6,774,755 B2 * | 8/2004 | Nakata et al. | 336/83 |
| 6,774,757 B2 * | 8/2004 | Fujiyoshi et al. | 336/200 |
| 6,828,894 B1 * | 12/2004 | Sorger et al. | 336/200 |
| 6,873,237 B2 * | 3/2005 | Chandrasekaran et al. | 336/83 |
| 2003/0146817 A1 * | 8/2003 | Lo | 336/212 |
| 2006/0114094 A1 * | 6/2006 | Jean et al. | 336/182 |

FOREIGN PATENT DOCUMENTS

| | | |
|---|---|---|
| JP | 04-085904 A | 3/1992 |
| JP | 07-249852 A | 9/1995 |

OTHER PUBLICATIONS

Patent Abstracts of Japan, vol. 016, No. 307 (E-1229), Jul. 7, 1992.

* cited by examiner

MAGNETIC STRUCTURE ASSEMBLY

INTRODUCTION

The present invention relates to a method of assembling a dual inductor on a printed circuit board and to the construction of such a dual inductor.

In certain types of power converters there is usually a requirement for a dual magnetic structure, for example twin inductors which share a common flux path. In many applications of this type the two inductors work such that their associated flux levels largely cancel in a central leg. This allows the central leg to be smaller and have lower losses than otherwise would be the case.

Dual magnetic structures of this type may be implemented in single printed board structures. A difficulty with this implementation is that the "open" nature of any air gap implies either excessive electrical magnetic interference generation or excessively costly containment measures. The large distance between input and output terminals of the inductor also implies a large loop area, which can cause radiating noise. Further, this adds considerably to the printed circuit board area, which is wasteful of area resources.

For cost reasons, in power converters it is necessary to use an output inductor with a small value. In practice, a high value of current slope can reduce turn-on loss and can alleviate reverse recovery effects. This implies a high value of ripple current. Therefore, achieving a low output ripple voltage can present problems to a designer. The problem is addressed by having a multi-stage filter. Initially, one can use ceramic capacitors, which can handle high ripple current with minimal loss and then some small value inductance can be added to achieve a reduction in ripple voltage. The inductance values required are typically small. For example, at 400 KH an inductance of 10 nH will have impedance of 25 m Ω which is material in the context of capacitor impedance of approximately 15 m Ω. However, this design adds complexity to the power converter.

It will be appreciated that in this specification the term "printed circuit board" is to be afforded a broad interpretation in that it is intended to encompass main sections and sub-sections of board such that a metal stamping could be considered to function as a printed circuit board section.

Common mode noise is a problem associated with power converters, both for those using dual and single inductors. In a typical power converter common mode noise is reduced by keeping all voltages appearing across transformer capacitance's "balanced", so that the output ground is kept close to the potential of the input ground connection. This is usually facilitated by the use of "double-ended" configurations where voltage excursions by one part of the winding are often balanced by excursions of another part of the winding. This is achieved quite readily in topologies such as the push-pull where there is excellent cancellation due to the symmetry of the input winding. However, in some configurations the whole output winding "moves" relative to output ground thus giving a clear common mode voltage differential and associated current flows, which leads to common mode noise within the power converter.

The present invention is directed towards a solution for the above-mentioned problems.

A further object of the present invention is to eliminate common mode noise associated with power converters.

STATEMENTS OF INVENTION

According to the invention, there is provided a method of assembling a dual inductor on a printed circuit board (PCB) comprising:—
   forming a through hole in the PCB;
   mounting a first winding across the hole;
   securing the first winding to a first face of the PCB;
   inserting a core assembly into the hole from the direction of the second face of the PCB; and
   at some stage in the assembly, mounting a second winding on the core assembly.

This is a particularly useful assembly operation as it is totally compatible with surface mount technologies it also reduces the height above the board of the inductors.

There are additional advantages, as detailed below, which arise both from the general construction and this assembly method.

In one way of carrying out the method, the second winding is secured to the second face of the PCB.

In another way of carrying out the invention, the hole is so formed that one or both of the windings rest on the respective face.

In a still further method according to the present invention, there are performed the steps comprising:—
   mounting an inductive element in close proximity to the first and second windings; and
   connecting the inductive element through a capacitive element to provide a ripple current cancelling signal for the dual inductor.

In this latter method, when the dual inductor forms part of a power converter circuit, the inductive element and capacitive element are connected between the input and output grounds of the power converter circuit.

Ideally, each of the windings is so configured that the input and output are in close proximity.

In one method according to the invention, at least one of the windings is formed by metal stamping.

In another method according to the invention, at last one of the windings is formed by a PCB section.

Further, the invention provides a dual inductor comprising:—
   a core assembly formed from a central plate and a set of three parallel spaced-apart legs, namely an inner leg and outer legs on opposed faces of the central plate forming first and second cores; and
   a first and second winding on the inner leg of each of the first and second cores, in which at least one of the windings extends outside one of the outer legs to provide additional inductance.

This construction leads to a considerable size reduction because effectively, the area taken up by the two inductors equates to that which would be normally taken up by one. As PCB boards incorporate more and more components and miniaturisation becomes more desirable, this is a serious consideration.

Ideally, the input and output of each set of windings are in close proximity.

In one embodiment, this dual inductor comprises:—
   a separate inductive element in close proximity to the windings; and
   a capacitive element connected to the inductive element, the output of the capacitive element providing a ripple current cancelling signal.

In one embodiment, the inductive element is a length of insulated copper wire close to the first and second windings.

The construction is compatible with low radiated emission requirements. The particular construction of inductive element is simple, inexpensive and versatile. It additionally reduces space requirements on the PCB.

In another embodiment of the invention, each winding is formed from a metal stamping.

As well as being relatively inexpensive, a metal stamping is robust, has low conductive losses and is particularly suitable for use with modem assembly techniques.

When the winding is so formed, the stamping is recessed to receive a PCB section forming the inductive element.

In a still further embodiment of the invention, each winding is formed by a PCB section.

In the latter embodiment, the inductive element may be formed by the PCB section.

Further, the invention provides a power converter incorporating the dual inductor as detailed above.

Further, the invention provides a PCB incorporating the dual inductor as described above.

DETAILED DESCRIPTION OF THE INVENTION

The invention will be more clearly understood from the following description of some embodiments thereof, given by way of example only, with reference to the accompanying drawings, in which:—

Figure 2:
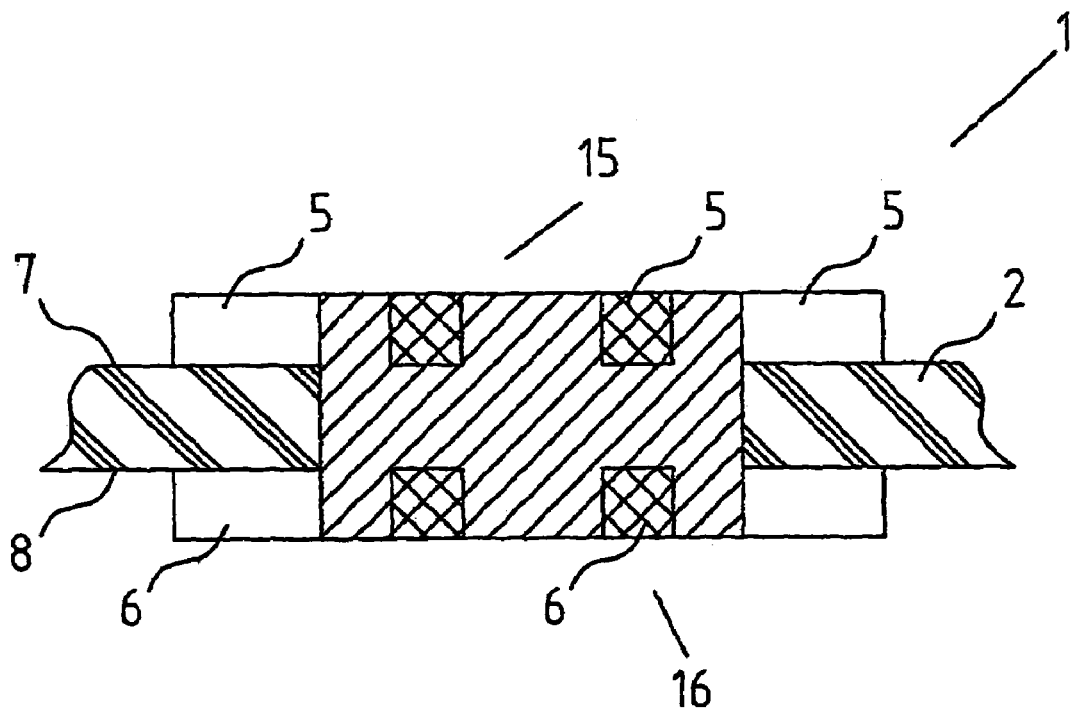
Figure 3:
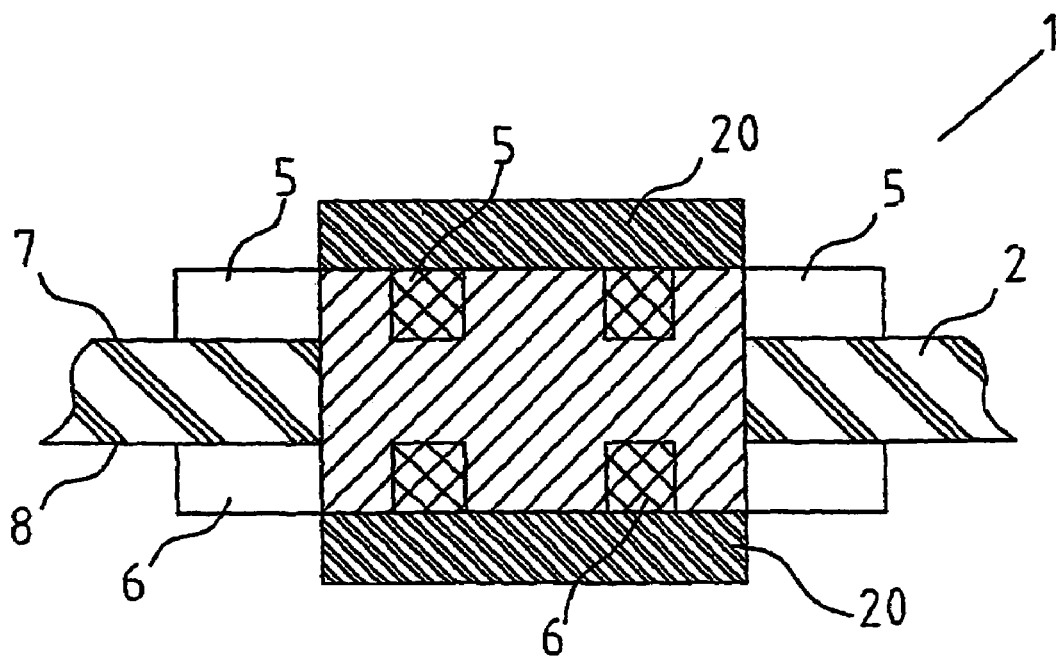
Figure 4:
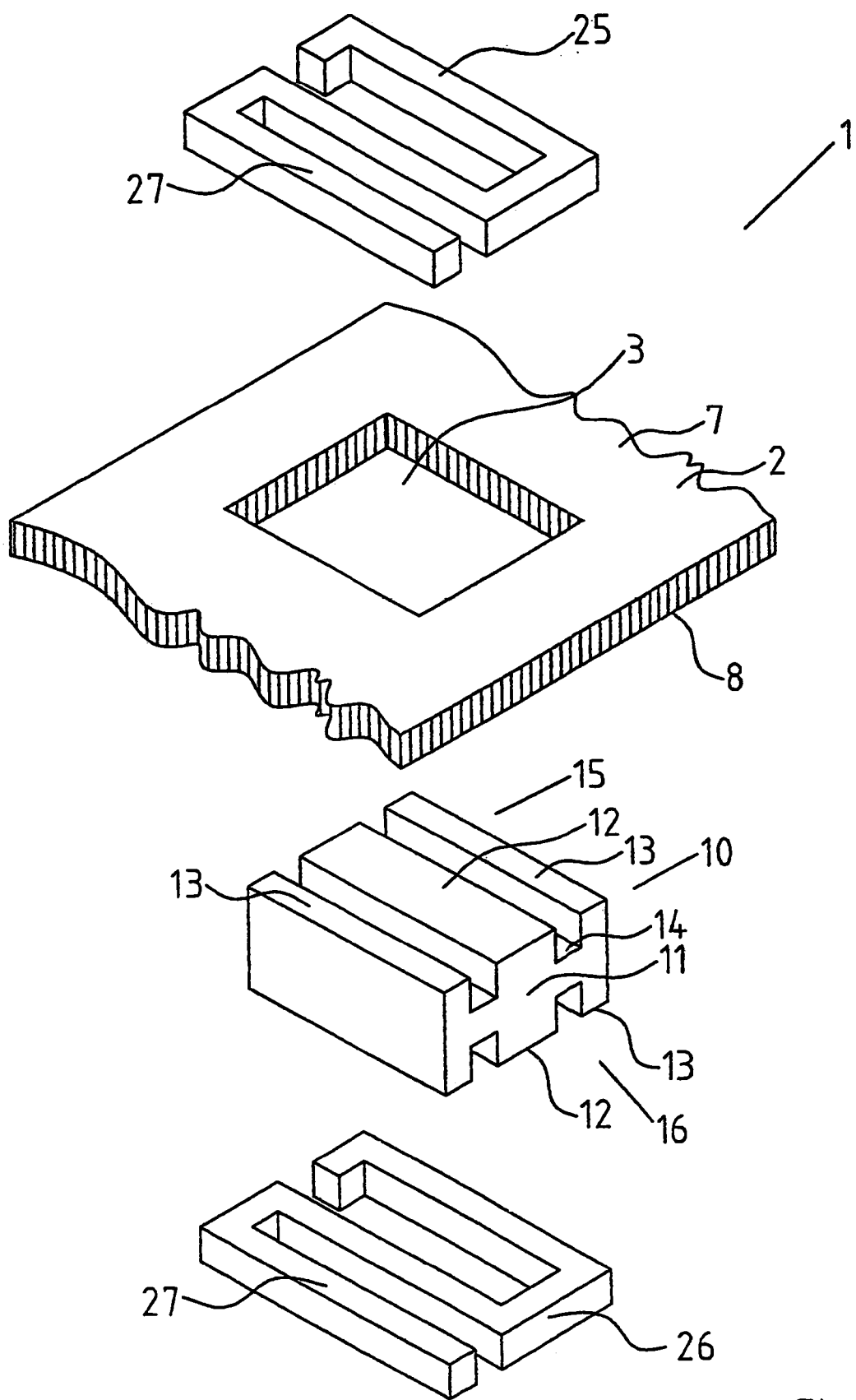
Figure 5:
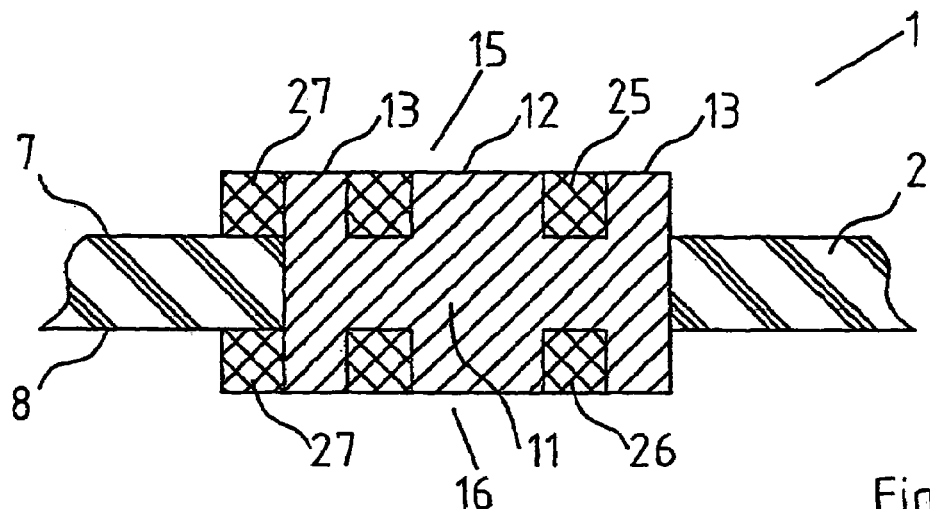
Figure 6:
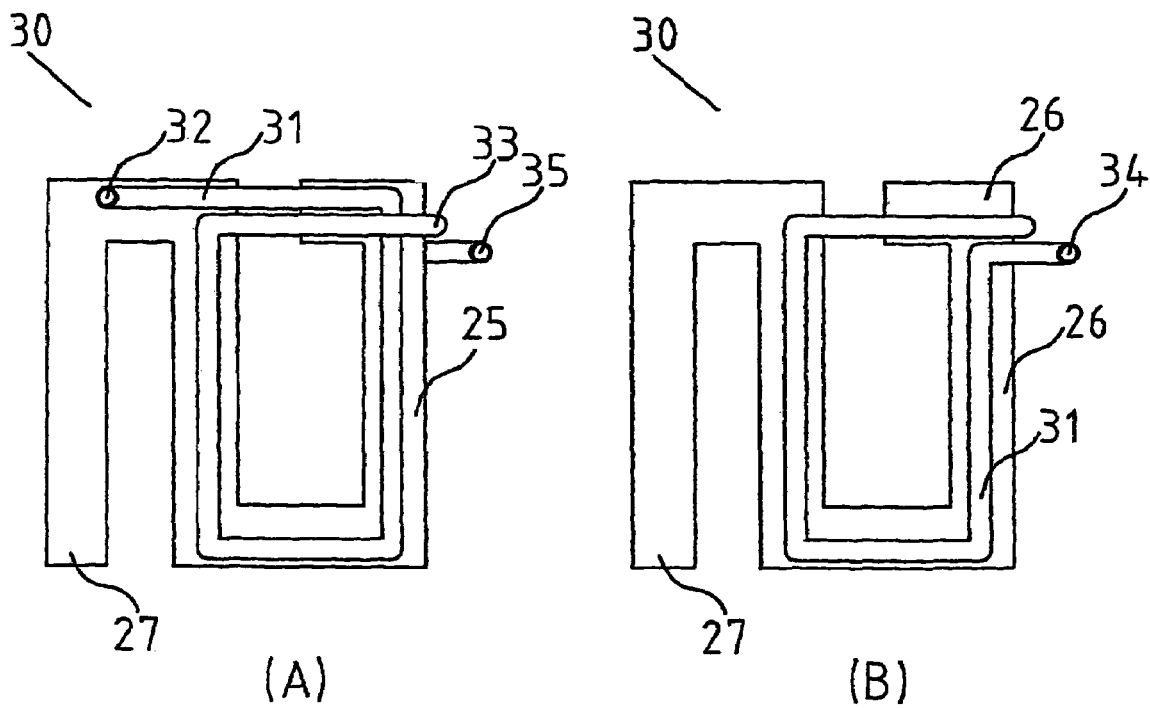
Figure 8:
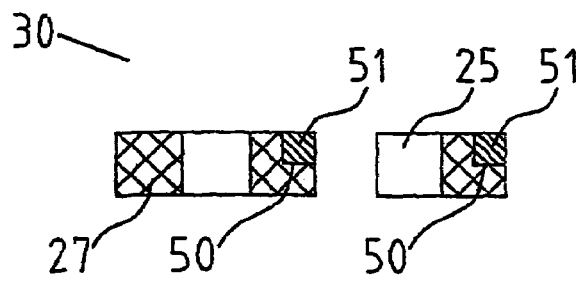
Figure 7:
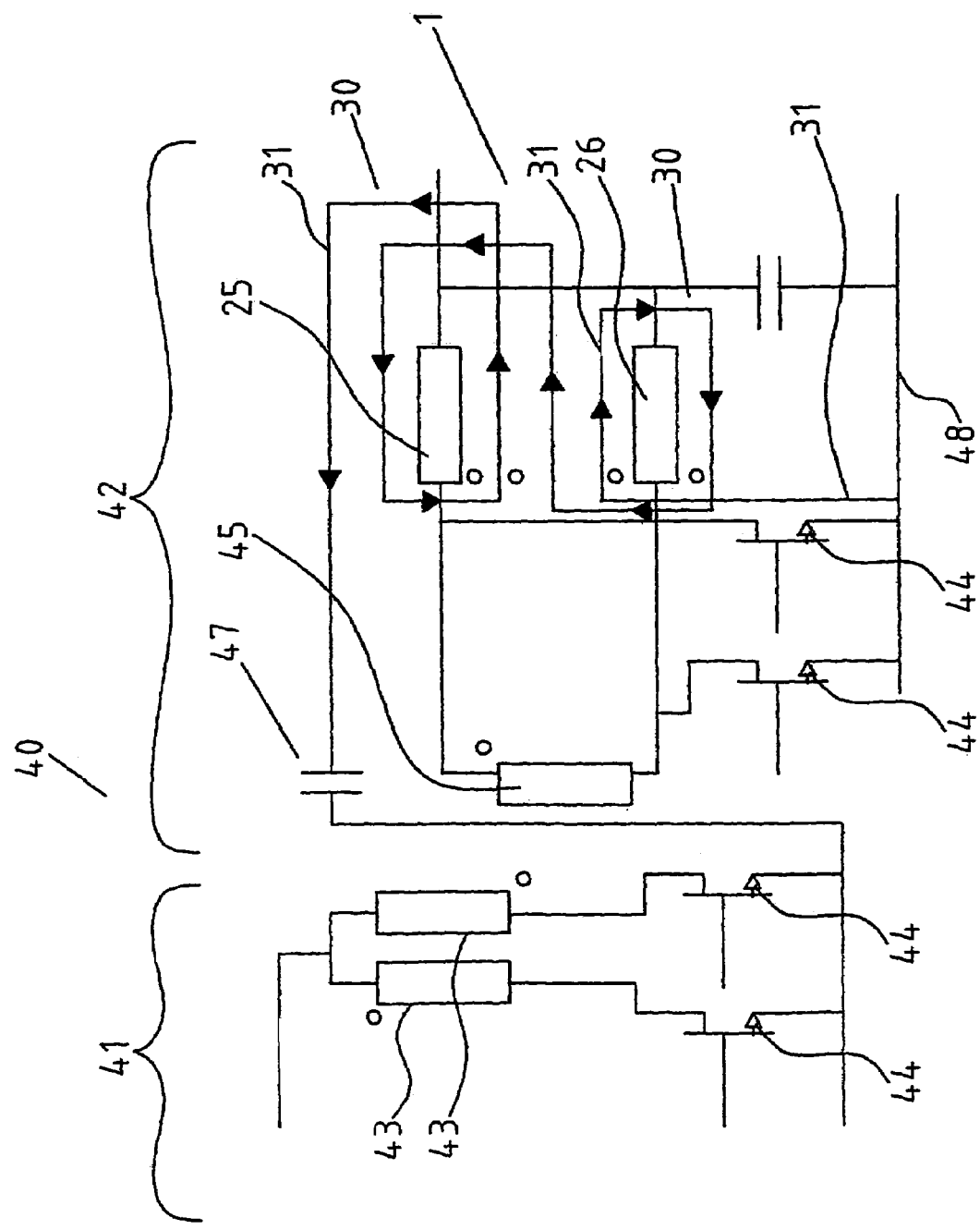

FIG. 1 is an exploded perspective view of a dual inductor according to the invention, FIG. 2 is a cross sectional view of the assembled dual inductor, FIG. 3 is a view similar to FIG. 2 showing further assembly of the inductor, FIG. 4 is an exploded view similar to FIG. 1 of another dual inductor according to the invention, FIG. 5 is a sectional view of the assembled inductor of FIG. 4, FIG. 6(A) is a plan top view of a first winding and FIG. 6(B) is a view from below from a second winding according to the invention, illustrating an additional inductive element used in the power converter for noise cancellation, FIG. 7 is a schematic circuit diagram of a power converter incorporating a dual inductor and the additional inductive element according to the invention, and FIG. 8 is a section through a winding of the invention.

Referring to the drawings and initially to FIGS. 1 and 2 thereof, there is provided a dual inductor, indicated generally by the reference numeral 1, for mounting on a PCB 2 having a straight-through hole 3 cut therein. The PCB board has a first face 7 and a second face 8. The dual inductor 1 comprises a pair of windings, namely, a first winding 5 and a second winding 6, both manufactured from metal stampings. There is also provided a core assembly, identified generally by the reference numeral 10, having a central plate 11 mounted between two sets of parallel spaced-apart legs, namely an inner leg 12 and a pair of outer legs 13 on the opposed faces 14 of the central plate 11, in effect forming first and second cores, indicated generally by the reference numerals 15 and 16.

To assemble the dual inductor 1 on the PCB board 2, the hole 3 is first cut in the PCB board. The first winding 5 is placed in position over the hole 3 against the first face 7 of the PCB 2. Then the first winding 5 is secured to the first face 7 of the PCB by re-flow. Then the core assembly 10 is pushed up to engage the first core 15 into the first winding 5. The second winding 6 is then placed into the second core 16 and again is secured to the underneath face, namely the second face 8, of the PCB 2 by reflow. This can be seen in FIG. 2.

Then, referring to FIG. 3, additional ferrite plates forming caps 20 are placed in position.

Referring to FIGS. 4 and 5, there is illustrated an alternative construction of dual power converter, again indicated generally by the reference numeral 1, in which parts similar to those described with reference to the previous drawings, are identified by the same reference numerals. In this embodiment, there is provided a first-winding 25 and a second winding 26 of substantially the same construction as the previous metal stamped windings 5 and 6 of FIGS. 1 to 3, except that there is provided an additional winding 27 which is essentially an extension of the stamping and thus of the main winding. Thus, it will be noted that the winding 27 extends outside one of the outer legs 13 of both the first and second cores 15 and 16. This provides additional inductance.

Referring now to FIGS. 6(A) and (B) and to FIG. 7, there is illustrated an inductive element 30 provided by an insulated copper wire 31, mounted at 32 on the winding 25 and led around the winding 25 so that it will encompass the inner leg 12 of the first core 15. The wire 31 is then led down at 33 through the PCB 2 to the second winding 26 where again it is led around the winding 26 to encompass the inner leg 12 of the second core 16. It is then led back up at 34 to an output terminal 35. The wire 30 forms a single turn winding.

The inductive element 30, namely, the wire 31, is now shown in FIG. 7 which illustrates a power converter circuit comprising a power circuit, indicated generally by the reference numeral 40, having an input stage 41 and an output stage 42. The input stage 41 comprises a pair of primary windings 43. There are also various switches, identified in each case by the reference numeral 44. The secondary 45 of the power converter is connected at both, ends to the dual inductor, again identified by the reference numeral 1 with the windings 25 and 26 shown. To show how the copper wire forming the inductive element 30 is wrapped around the first and second windings 25 and 26, arrows are used. The inductance element, in this case, the copper wire 30 is connected to ground of the output stage 42. Then the inductive element is connected to a capacitive element 47, in this case a capacitor 47.

In operation, there will be ripple currents. The capacitor 47, which forms the capacitance element, is connected to ground of the input stage 41. Thus, it will be seen that the inductance element 30 is connected between the two grounds, namely, of the input stage 41 and the output stage 42. In operation, the inductance element 30 will acquire any noise in the first and second windings 25 and 26 which will then be transmitted to the capacitance 47 to provide a ripple current cancelling signal for the dual inductor 1, such that the output from the dual inductor 1 will no longer have this ripple current.

While in the above, the inductive element has been described as being connected between the input stage ground and the output stage ground, it could be connected to other points in the respective stages, as long as that point had a minimal differential voltage with the corresponding ground.

It is envisaged that instead of the use of an insulated copper wire for the element, a cut-out could be formed in each of the stampings and a PCB section used to provide the inductive element, as illustrated in FIG. 8 which shows the winding 25 of FIG. 4 incorporating a recess 50 in which is mounted a PCB section 51 forming the inductive element 30.

Similarly, it will be appreciated that instead of a stamping, a PCB section could be used to form, not alone the first and second windings, but could also be used to form the inductive element and indeed, a PCB section would be more suitable when a windings more than one turn is required.

It will be appreciated that one of the great advantages of the arrangement of FIGS. 6 and 7 is that the input and output terminals of the dual inductor can be positioned close together allowing for close placement of a capacitor with low loop area and consequently low electrical magnetic interference (EMI) which is not shown. The magnetic path is also closed resulting in a smaller stray flux which can cause interference problems.

The inductive element 30 may be formed as a single turn, as illustrated, or as multiple turns or a fractional turn, as required.

The centre leg 12 will normally be of a low permeability material or may incorporate an air gap as is known in the art.

The manufacturing method according to the present invention is particularly advantageous and while in the embodiment described above, the first and second windings have both been shown separately mounted on the PCB, it is appreciated that the whole assembly could be preformed so that it could be slotted into the hole with possibly only one of the two windings actually contacting the PCB board. Indeed, in certain embodiments, it may not be necessary for either of the windings to overly the PCB board. Needless to say, any suitable fixing means may be provided such as pins, solder, paste, reflow techniques, and so on. It will be appreciated that the use of the solid piece of stamped metal is particularly suitable for single turn sections. Preferably, such metal would be pre-tinned copper and would almost certainly use solder paste techniques. Needless to say, normal machine fixing and placement may be used.

While the dual inductor described above is a particularly suitable construction for use in a current doubler, it will be appreciated that this construction may not always be used. For example, single inductors could be used, constructed similarly to the dual inductor of the invention and incorporating, if necessary, the inductive element.

The present invention is particularly suitable to DC-DC converters using a format known as the "half-brick". Generally speaking, such a converter would have, for example, an output pin spacing of 35 mm or so. In order to achieve low noise performance, it is necessary to route the output tracking. The construction of winding, as illustrated in FIGS. 4 and 5, is particularly suitable for low noise performance as this routes the output tracking so that any capacitors that are used can have minimum lead lengths and low loop area. The particular shape, namely the S-shape pieces of copper or, needless to say, printed circuit board sections, allow extra track capacity to be used thus reducing losses, for example in a power converter.

As has already been illustrated in FIGS. 6(A) and (B) and to FIG; 7, the use of the filter inductor to reduce ripple current in power converters is particularly useful. It is known, for example, in the prior art, to provide inductance values of the order of 10 nH. The present invention provides a simple implementation of this by the use of the additional winding or stamped track, as illustrated in the embodiment of FIG. 4.

It will be appreciated that while dual magnetic structures and integrated post-filter inductor applications are disclosed for converters, the invention can be incorporated into other applications such as that for micro-electronics and integrated circuit design.

The common mode signal may be attenuated using a capacitive potential divider by fitting capacitors between the input ground and output ground. An effective compliment to this approach involves injecting a neutralising signal with the capacitor to cancel any interfering signal.

It will be appreciated in the case of the twin inductor output rectifier configuration commonly known as a current doubler, the output winding is alternatively completely at output ground or one end is lifted to the level of the transformer 45 output stage. The next effect is to have the complete winding moving between 0 and half the transformer output level. For example, in the case of a 48 Volt input converter with a 4:1 turns ratio the voltage and the winding varies between 0 and 6 volts. It will be appreciated given the large capacitance value that maybe employed in modem converters using planar magnetics, this voltage level imposes design criteria in the amount of external filtering required to achieve EN 55022 and other similar standards.

In the specification the terms "comprise, comprises, comprised and comprising" or any variation thereof and the terms "include, includes, included and including" or any variation thereof are considered to be totally interchangeable and they should all be afforded the widest possible interpretation. The term theoretical refers to the scientific community and not the inventor.

The invention is not limited to the embodiments hereinbefore described but may be varied in both construction and detail with the scope of the claims.

The invention claimed is:

1. A dual inductor (1) comprising:
   a core assembly (10) formed from a central plate (11) and a set of three parallel spaced-apart legs, namely an inner leg (12) and outer legs (13) on opposed faces (14) of the central plate (11) forming first and second cores (15, 16); and
   a first and second winding (5, 6 and 25, 26) on the inner leg (12) of each of the first and second cores (15, 16), in which at least one of the windings (25, 26) extends outside one of the outer legs (13) to provide additional inductance.

2. A dual inductor (1) as claimed in claim 1, in which the input and output of each set of windings (5, 6 and 25, 26) are in close proximity.

3. A dual inductor (1) as claimed in claim 1, comprising:
   a separate inductive element (30) in close proximity to the windings (25, 26); and
   a capacitive element (47) connected to the inductive element (30), the output of the capacitive element (47) providing a ripple current cancelling signal.

4. A dual inductor (1) as claimed in claim 3, in which the inductive element (30) is a length of insulated copper wire (31) close to the first and second windings (25, 26).

5. A dual inductor (1) as claimed in claim 1, in which at least one of the windings (5, 6 and 25, 26) is formed from a metal stamping.

6. A dual inductor (1) as claimed in claim 5, in which the metal stamping (25, 26) is recessed to receive a PCB section forming an inductive element (30).

7. A dual inductor (1) as claimed in claim 1, in which each winding (5, 6 and 25, 26) is formed by a PCB section.

8. A dual inductor (1) as claimed in claim 7, in which an inductive element (30) is formed by the PCB section.

9. A power converter (40) comprising the dual inductor (1) as claimed in claim 1.

10. A PCB (2) comprising the dual inductor (1) as claimed in claim 1.

11. A current doubler comprising the dual inductor (1) as claimed in claim 1.

* * * * *